(12) United States Patent
Barnes et al.

(10) Patent No.: US 8,795,466 B2
(45) Date of Patent: Aug. 5, 2014

(54) SYSTEM AND METHOD FOR PROCESSING SUBSTRATES WITH DETACHABLE MASK

(75) Inventors: Michael S. Barnes, San Ramon, CA (US); Terry Bluck, Santa Clara, CA (US)

(73) Assignee: Intevac, Inc., Santa Clara, CA (US)

( * ) Notice: Subject to any disclaimer, the term of this patent is extended or adjusted under 35 U.S.C. 154(b) by 1170 days.

(21) Appl. No.: 12/495,724

(22) Filed: Jun. 30, 2009

(65) Prior Publication Data

US 2010/0003768 A1    Jan. 7, 2010

Related U.S. Application Data

(60) Provisional application No. 61/077,054, filed on Jun. 30, 2008, provisional application No. 61/176,003, filed on May 6, 2009.

(51) Int. Cl.
  *H01L 21/306* (2006.01)
(52) U.S. Cl.
  USPC .............. 156/345.3; 204/298.11; 204/298.25; 118/721
(58) Field of Classification Search
  USPC .............. 204/192.34, 192.1, 192.12, 298.11, 204/298.25; 156/362, 64, 345.1–345.55; 118/719, 720, 721, 668, 669, 686, 687, 118/698, 704; 414/935, 936, 937, 938, 939, 414/940, 941
  See application file for complete search history.

(56) References Cited

U.S. PATENT DOCUMENTS

| | | | |
|---|---|---|---|
| 4,158,591 A | | 6/1979 | Avery et al. |
| 4,570,279 A | * | 2/1986 | Yoshizawa ..................... 15/97.1 |
| 4,851,095 A | * | 7/1989 | Scobey et al. ............ 204/192.12 |
| 5,026,239 A | * | 6/1991 | Chiba et al. .................... 414/217 |
| 5,258,077 A | | 11/1993 | Shahryar |
| 5,744,214 A | * | 4/1998 | Berasi et al. .................. 428/137 |
| 5,844,195 A | | 12/1998 | Fairbairn et al. |
| 5,846,328 A | * | 12/1998 | Aruga et al. .................. 118/718 |
| 6,030,513 A | * | 2/2000 | Ghantiwala et al. ..... 204/298.11 |

(Continued)

FOREIGN PATENT DOCUMENTS

| | | |
|---|---|---|
| CN | 101635253 A | 1/2010 |
| DE | 10032279 A1 | 1/2002 |

(Continued)

OTHER PUBLICATIONS

Extended European Search Report and Search Opinion in European Application No. 09164159.7, mailed Nov. 10, 2009.

(Continued)

*Primary Examiner* — John Brayton
(74) *Attorney, Agent, or Firm* — Nixon Peabody LLP; Joseph Bach, Esq.

(57) ABSTRACT

Apparatus and methods are provided that enable processing of patterned layers on substrates using a detachable mask. Unlike prior art where the mask is formed directly over the substrate, according to aspects of the invention the mask is made independently of the substrate. During use, the mask is positioned in close proximity or in contact with the substrate so as to expose only portions of the substrate to processing, e.g., sputtering or etch. Once the processing is completed, the mask is moved away from the substrate and may be used for another substrate. The substrate may be cycled for a given number of substrates and then be removed for cleaning or disposal.

15 Claims, 7 Drawing Sheets

(56) References Cited

U.S. PATENT DOCUMENTS

| | | | |
|---|---|---|---|
| 6,045,671 A * | 4/2000 | Wu et al. | 506/40 |
| 6,176,967 B1 | 1/2001 | Obszarny | |
| 6,264,804 B1 * | 7/2001 | Lee et al. | 204/192.12 |
| 6,319,373 B2 | 11/2001 | Takeyama et al. | |
| 6,919,001 B2 | 7/2005 | Fairbairn et al. | |
| 6,974,976 B2 | 12/2005 | Hollars | |
| 2003/0211275 A1 | 11/2003 | Buitron et al. | |
| 2006/0174829 A1 | 8/2006 | An et al. | |
| 2007/0009652 A1 | 1/2007 | Manz et al. | |
| 2007/0283996 A1 | 12/2007 | Hachtmann et al. | |
| 2008/0053519 A1 | 3/2008 | Pearce et al. | |
| 2008/0251120 A1 | 10/2008 | Malmstrom et al. | |
| 2008/0289953 A1 | 11/2008 | Hollars | |

FOREIGN PATENT DOCUMENTS

| | | | |
|---|---|---|---|
| EP | 2141733 A1 | 1/2010 | |
| JP | 63-107121 A | 5/1988 | |
| JP | 06-168874 A | 6/1994 | |
| JP | 06-168919 A | 6/1994 | |
| JP | 2000-133828 A | 5/2000 | |
| JP | 2001-210695 A | 8/2001 | |
| JP | 2004-087981 A | 3/2004 | |
| JP | 2004-349367 A | 12/2004 | |
| JP | 2006-219760 A | 8/2006 | |
| JP | 2006-324590 A | 11/2006 | |
| JP | 2010-080919 A | 4/2010 | |
| WO | 03/043067 A1 | 5/2003 | |
| WO | 2009/148087 A1 | 12/2009 | |
| WO | 2009/148117 A1 | 12/2009 | |

OTHER PUBLICATIONS

"Spike RTA+ms annealing may delay need for metal gates," Solid State Technology—Technology News, Oct. 2007.

Rommel Noufi, et al., "High-Efficiency CDTE and CIGS Thin-Film Solar Cells: Highlights and Challenges," National Renewable Energy Laboratory, May 2006.

A. Compaan, et al., "Fabrication and Phyics of CdTe Devices by Sputtering," Final Report Mar. 1, 2005—Nov. 30, 2008, National Renewable Energy Laboratory, Apr. 2009.

Chinese Second Office Action for Application No. 200910158443.2 dated Apr. 16, 2013.

Chih-Hsiang Yang, "Nano-Crystalline Manipulation to Achieve Laser-based Crack-Free Edge Isolation for Silicon-Based Solar Cells", Aug. 2012, North Carolina State University.

Chinese Office Action for Application No. 200910158443.2 dated Sep. 6, 2012.

European Examination Report for Application No. 09164159.7 dated Apr. 29, 2013.

Japanese Office Action for Application No. 2009-156088 dated Nov. 20, 2012.

Japanese Office Action for Application No. 2009-156088 dated Jan. 29, 2013.

Japanese Office Action for Japanese Application No. 2009-156088, mailed on Jul. 16, 2013.

Notice of Grant in Japanese Patent Application No. 2009-156088 dated Nov. 12, 2013.

* cited by examiner

SYSTEM AND METHOD FOR PROCESSING SUBSTRATES WITH DETACHABLE MASK

RELATED APPLICATIONS

This application claims priority benefit from U.S. provisional applications Ser. Nos. 61/077,054 and 61/176,003, filed on Jun. 30, 2008 and May 6, 2009, respectively, the entire disclosure of which is incorporated herein by reference.

BACKGROUND

1. Field

The subject invention relates to processing of substrates, especially for processing substrates fabricated to operates as photovoltaic cells.

2. Related Art

Substrate processing tools are used to make hard-drive disks, semiconductor computer chips, solar panels, and the like, from substrates made of materials such as semiconductor wafers, glass, stainless steel, etc. Typically, the substrate processing tools includes several substrate chambers that perform various processes that modify the substrate, such as, deposition, cleaning, etch, heat/cool, etc. While in the semiconductor fabrication field the various processing steps, such as deposition and etch, are performed on only selected parts of the substrate, in hard-drive disks and solar processing the processing is generally performed over the entire surface of the substrate.

For example, it is known in the semiconductor processing field to delineate the various circuit elements by forming masks over the surface of the substrate. The masks are generally made of photoresist, which is exposed to radiation and development to form the desired pattern. Then the substrate is processed in the chamber to transfer the pattern to the selected layer of the substrate, sometimes by first transferring the pattern onto a secondary hard mask. Thereafter, the mask is removed and the surface of the substrate is cleaned and prepared for the next mask. This sequence is repeated many times as the various layers are formed over the substrate by repeatedly forming and removing masks of different designs. It should be appreciated that the use of such masks, while indispensable in the semiconductor art, dramatically increases the time and costs of fabricating semiconductor circuits.

In hard-drive disks and solar fabrication, on the other hand, generally no individual cells are formed, but rather various layers are formed over the entire substrate so as to generate a stack of various materials that function as magnetic memory or photovoltaic cell, respectively. For example, in most of the solar cells, the various layers generally include a back contact layer, an absorption layer (e.g., p-type), a complementary layer, which is generally referred to as buffer or window layer (e.g., n-type), transparent top contact layer, and a protective and/or anti-reflective layer. For example, when forming copper-indium-gallium-selenide (CIGS) solar cells, a back conductor layer, such as molybdenum, is first formed over the substrate, followed by a layer of p-type CIGS layer, followed by buffer layer of n-type, e.g., cadmium sulfide, CdS, followed by a transparent conductive layer, e.g., zinc oxide, ZnO or indium tin oxide, ITO.

Due to the solar cell structure, the material usually chosen for the top conductive layer generally has high resistance. Therefore, in order to increase current collection from the cell, a pattern or grid of higher conductivity material is fabricated on top of the stack. This top grid is generally made of conductive paste, such as silver paste, using silk screen or inkjet-style printing technology. However, it is desirable to develop technology to enable fabrication of patterned conductive layer of higher quality and less resistivity than achievable using the printing technology.

Additionally, in certain solar cells structure a short or shunt is sometimes inadvertently formed at the edge of the substrate between the bottom and top conductive layers. This problem is especially problematic with CIGS thin film solar cells. Prior art methods utilized for removal of such shunts include wet bath etching, batch plasma etching, and laser scribing. In wet etching the wafer is placed on the surface of an acid solution in a bath, a small wave is created in the bath so that the acidic solution contacts the wafer and the surface tension of the liquid provides uniform etching of the back surface of the wafer. In batch etching the wafers are stacked together like coins and placed in a barrel-type etcher, so that only the periphery of the stacked wafers is etched. In laser scribing, laser beam is used to scribe a groove almost at the edge of the wafer. However, it is desirable to provide technology that provides better solution to edge shunt.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspects of the invention, apparatus and methods are provided that enable processing of patterned layers on substrates using a detachable mask. Unlike prior art where the mask is formed directly over the substrate, according to aspects of the invention the mask is made independently of the substrate. During use, the mask is positioned in close proximity or in contact with the substrate so as to expose only portions of the substrate to processing, e.g., deposition, sputtering, etch, etc. Once the processing is completed, the mask is moved away from the substrate and may be discarded or used for another substrate. The substrate may be cycled for a given number of substrates and then be removed for cleaning or disposal.

According to one aspect of the invention, the mask is made of hard material, such as stainless steel, and has openings in the shape of the pattered to be formed on the substrate. The mask is placed over the surface of the substrate, in contact or in close proximity, and sputtering is performed so as to deposit material on the surface of the substrate through the openings in the mask. The mask may be discarded or cleaned after each substrate or after deposition on several substrates.

According to another aspect of the invention, the mask is used in an etch processing, for example, to avoid or repair edge shunt. According to one embodiment, the mask is made of a solid material having the shape of the substrate, but having a circumference that is a bit smaller from the substrate's circumference. The mask is placed over the substrate and etch is performed over the mask using, e.g. plasma or ion beam. Since the mask covers most of the substrate, the ion beam or plasma will cause etching of only the circumference of the substrate, thereby removing the top conductive layer about the circumference of the substrate. Consequently, edge shunt is avoided.

According to aspects of the invention, a substrate processing system is provided, comprising: a plurality of processing chambers; substrate carriers; drive mechanism enabling the substrate carriers to travel from chamber to chamber; and, mask load/unload module for loading masks onto the substrate carriers so as to obscure at least part of the substrate on said substrate carrier, and unloading masks from the substrate carriers after processing the substrate. The system may further comprise a substrate load/unload module for loading fresh substrates onto the substrate carriers and unloading processed substrates from the substrate carriers and/or front end module delivering substrate cassettes to the system. The mask load/unload module may comprise a loadlock for introducing and removing masks or mask cassettes into vacuum environment. The mask load/unload module may further comprise lift blade for removing masks from the mask cassettes. The processing chamber may comprise at least one of a sputtering chamber and an etch chamber. The plurality of processing chambers may comprise a first linear row of processing chambers and a second linear row of processing chambers stacked on the first linear row, and wherein mask load/unload module comprises a mask load module and a mask unload module stacked one above the other. Each of the substrate carriers may comprise a mechanical mechanism, temporary adhesive, or magnetic mechanism for attaching the mask in front of the substrate.

According to an aspect of the invention, a method of processing substrates is provided, comprising: loading the substrate onto a substrate carrier; transferring the carrier onto a mask loading module; loading a mask onto the carrier such that the mask partially obscures one surface of the substrate; transferring the carrier for plasma processing in at least one plasma processing chamber; removing the mask from the carrier; and, removing the substrate from the carrier. The method may further comprise providing a cassette having a plurality of masks therein and wherein loading a mask comprises removing one mask from the cassette and loading it onto the carrier. The method may further comprise providing a mask cassette and wherein after the mask has been removed from the carrier a predetermined number of times, the mask is placed in the cassette. After removing the mask from the carrier the method may proceed to: reload the mask onto an incoming carrier for processing; and, after the mask has been removed from the carrier a predetermined number of times, place the mask in a cassette. Once the cassette has been loaded with a predetermined number of masks, the cassette may be removed for discarding the masks or cleaning the mask for reuse.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A is a perspective view of a carrier with a pseudo square substrate without mask present, while

DETAILED DESCRIPTION

Figure 1A:
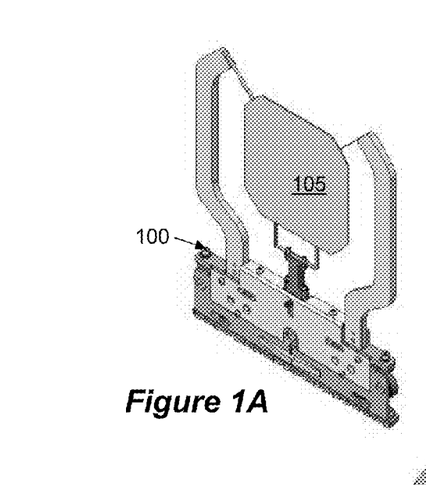
Figure 1B:
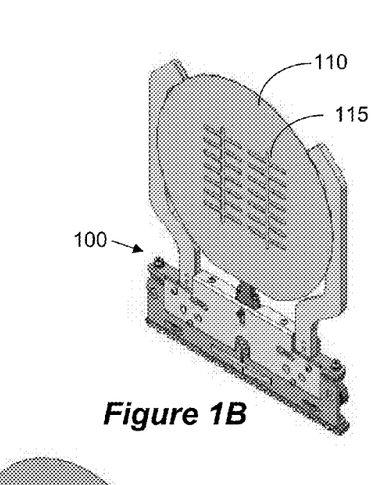
FIG. 1B is a perspective view of a carrier with a substrate and trace mask.

A detailed description will now be given of embodiments of the invention for enabling substrate processing using detachable masks. Such processing is particularly advantageous for solar cell fabrication. FIG. 1A is a perspective view of a substrate carrier 100 with a pseudo square substrate 105 without a mask present. In this particular example, the next processing step is to form a patterned layer over the surface of the substrate 105. For this purpose, a patterned mask is loaded onto the carrier in close proximity or actually touching the surface of the substrate. An example of a carrier with a patterned mask is depicted in FIG. 1B. In this example, the carrier 100 holds a pseudo square substrate 105 (obscured from view by the mask) and a trace mask 110 having a circuit pattern 115 carved out therein. The mask 110 is made of, for example, a 400 series stainless steel of 0.03" thickness. Once the mask 110 is loaded, the carrier is transferred into a sputtering chamber and sputtering is performed so as to sputter material onto the substrate 105 through the pattern 115 in the mask 110. This embodiment can be used, for example, for sputtering a conductive grid using, e.g., aluminum and silver. Such a grid can have better conductivity than printed grids.

As can be understood, according to embodiments of the invention, the mask 110 can be in contact or near contact with the substrate 105. The mask 105 can be attached to the carrier 100 with a mechanical method, such as spring clips, or can be made of a magnetic material (e.g., 400 series SS) and be magnetically held to the carrier 100 by magnets imbedded in the carrier. Of course, other methods may be devised to attach the mask 110 to the carrier 100. The mask can be used for deposition, etch, or similar processes.

Figure 1C:
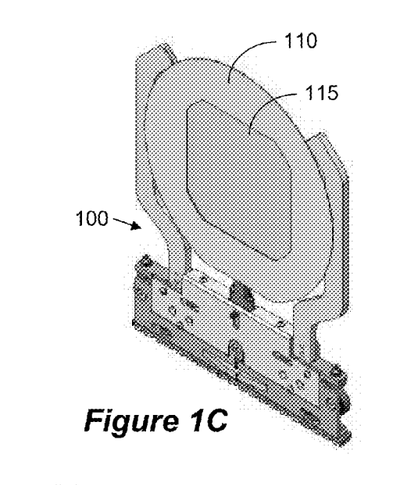
FIG. 1C illustrates a perspective view of a carrier with a substrate and trace mask in accordance with another embodiment of the invention.

While the above example relates to forming a patterned layer, embodiments of the invention can also be used for forming a non-patterned layer over the substrate. FIG. 1C illustrate an example wherein a mask 110 is used for forming a non-pattered layer. In the embodiment of FIG. 1C, the mask 110 has a single cutaway 115. The single cutaway 115 is in the shape of the pseudo-square substrate, but has a dimension that is slightly smaller than the substrate. This embodiment is particularly useful for forming a top layer such that it avoids edge shunt to the bottom conductor. For example, the bottom conductor, the CIGS, and the buffer layers can be formed without a mask, and then a mask can be loaded onto the carrier and the top transparent conductive layer is formed via the window using, e.g., sputtering. In this manner the top conductive layer is made a bit smaller than the substrate, such that it does not reach the edge of the substrate around the circumference and shunt to the bottom conductive layer is avoided.

Figure 1D:
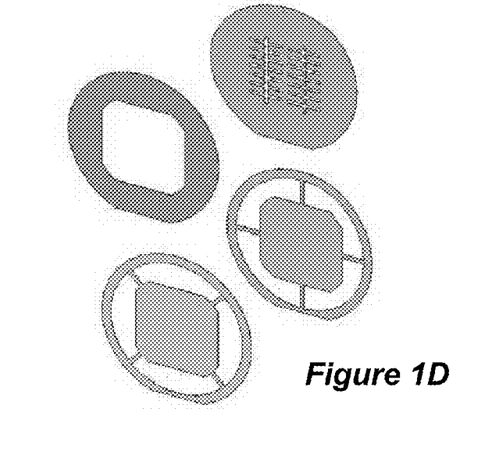
FIG. 1D illustrate examples of mask designs that can be used with various embodiments of the invention.

FIG. 1D illustrate examples of mask designs that can be used with various embodiments of the invention. Description of possible use for these particular mask designs is provided herein; however, it should be appreciated that these are only examples and that other designs can be made without departing from the scope and spirit of the invention.

Figure 1E:
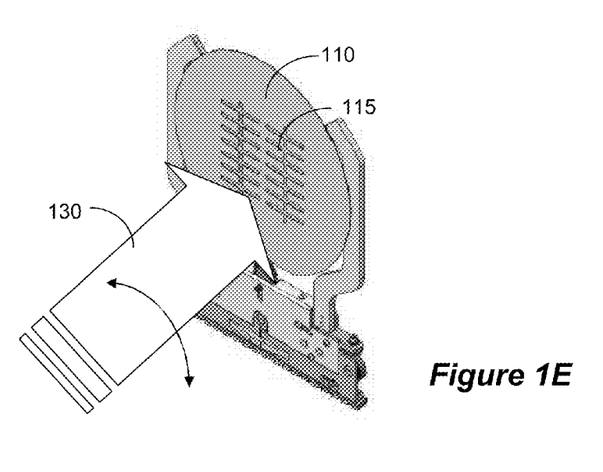
FIG. 1E is a schematic illustration for an ion beam milling, according to an embodiment of the invention.

FIG. 1E is a schematic illustration for an ion beam milling, according to an embodiment of the invention. The general art of focus ion beam milling is well known, and various known methods can be used to form an ion beam. The ion beam can be scanned over the mask, such that ion beam milling of the substrate occurs only via the design cut-out in the mask. In the example of FIG. 1E, a "ribbon" ion beam 130 is used and is scanned in one direction, vertically, as illustrated by the double-head arrow. If a "pencil" beam is used, a two-dimensional, i.e., horizontal and vertical, scanning can be used.

Figure 2:
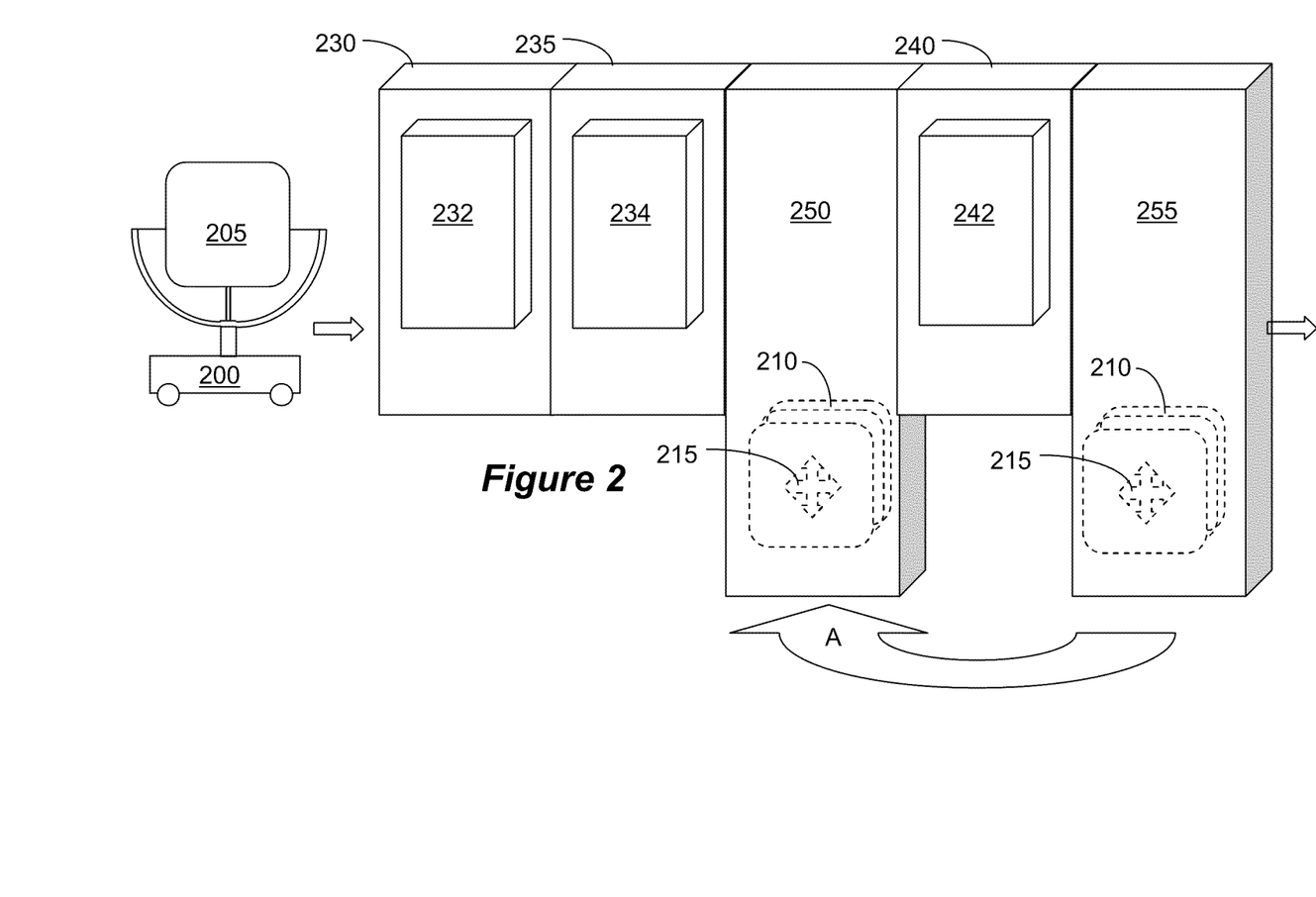
FIG. 2 illustrates a processing system in accordance with one embodiment of the invention.

FIG. 2 is a simplified schematic illustrating a processing system in accordance with one embodiment of the invention. In FIG. 2, carrier 200 holds and transports substrate 205 inside the processing system. The carrier may transport substrate 205 for processing in process chambers 230, 235 and 240. For example, Chambers 230 and 235 may include sputtering mechanisms 232 and 234, respectively, for sputtering blank, i.e., unpatterned, layers on substrate 205. Then, the carrier enters mask loading chamber 250, in which a mask from a plurality of masks 210 is loaded onto the carrier. The carrier then continues into chamber 240 for further processing in chamber 240. For example, chamber 240 may include a sputtering mechanism 242 for sputtering a patterned layer through pattern 215 in mask 210. Chamber 240 may also be an ion or reactive ion milling chamber utilizing, e.g., ion beam or plasma etching module. The chamber then enters a mask unloading chamber 255, where the mask 210 is unloaded from the carrier 200. The mask may then be returned to the mask loading chamber 250, as shown by arrow A, sent for cleaning, or disposed of.

Figure 3:
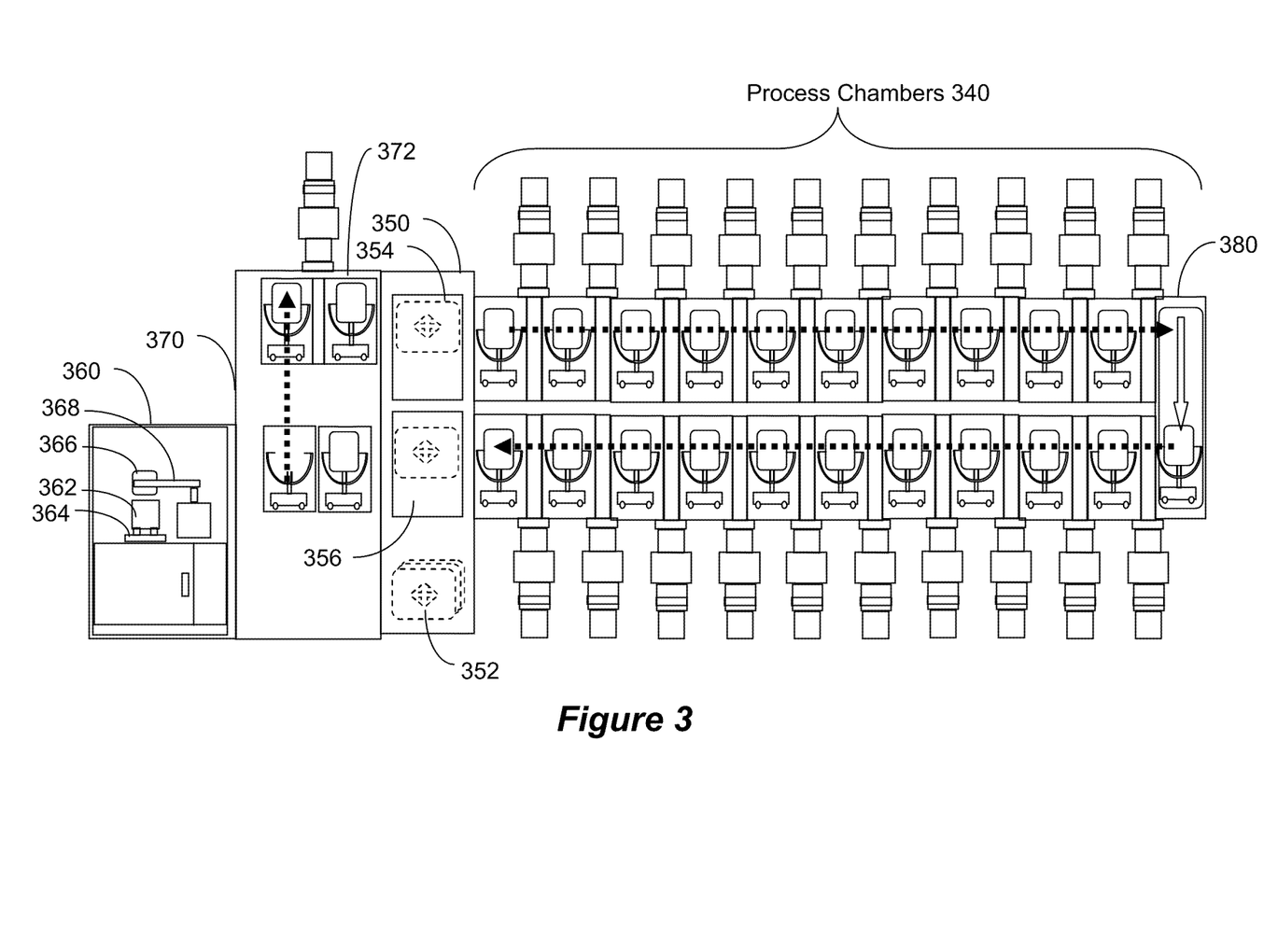
FIG. 3 is a simplified schematic illustrating a processing system in accordance with another embodiment of the invention.

FIG. 3 is a simplified schematic illustrating a processing system in accordance with another embodiment of the invention. The system of FIG. 3 includes a plurality of processing chambers 340 arranged linearly and stacked one row above the other. A carrier elevator 380 is provided at the end of the stacked processing chambers to lower carriers from the top row to the bottom row, as shown by the arrow. At the front of the stacked chambers are front end module 360, substrate loading module 370, and mask loading module 350. Front end module 360 has tracks 364 upon which cassettes 362 are transported so as to deliver substrates 366 to the system. Robot arm 368 removes substrates from the cassettes 362 and introduce them into substrate loading module 370. In substrate loading module 370 each substrate 366 is loaded onto a carrier, which is then introduce into one or more vacuum stations 372, so as to introduce the substrate 366 into a vacuum environment. Vacuum stations 366 may include vapor removal system, such as Meisner trap, etc. The carrier then moves into the mask loading station 370, where a mask is loaded onto the carrier. Thence, the carrier transports the substrate with the mask for processing in the top row of processing chambers 340, moves to the lower row via elevator 380, and then traverse the lower row of processing stations 340. The carrier then moves into the mask loading station 370, wherein the mask is removed from the carrier and is either placed in a masks cassette 352 to be removed for cleaning or discarding, or is loaded onto another carrier. The carrier is them moved to the substrate loading module 370, wherein the substrate is removed and the carrier is loaded with another substrate, or removed for clearing.

In one example, the mask loading module 350 may house five cassettes, each having 25 masks. According to one embodiment, the cassettes remain in atmospheric environment and the masks are loaded into the system via a vacuum load lock, while according to another embodiment the cassettes are held in vacuum environment. While not specifically illustrated in FIG. 3, a lift blade in vacuum can be used to remove each mask from the cassette and lift it up to a transfer head in the mask loading station 354. The transfer head takes the mask and places it onto a carrier 366 with an incoming substrate. This process is repeated until all system carriers have masks, at which time no more masks are taken from the cassette. When the process carrier arrives at the mask removal station 356, a transfer head removes the mask and places it on the lift blade. The lift blade then lifts the mask up to the mask loading station 354, where the transfer head places the used mask on another carrier with an incoming substrate. The masks are recycled until they have e.g., 100 cycles, and then they are placed back into the cassette and replaced with new masks. For increased throughput a second lift blade may be used to allow for placement of used masks back into the cassettes. The cassettes with used mask are removed from the system one at a time through an exit lock. While in this embodiment the mask loading module 350 is shown between the substrate loading module 370 and the processing module 340, it should be appreciated that it may be placed anywhere in the processing modules, such that some processing can be performed on the substrate prior to placing the mask and after removal of the mask, similar to what is illustrated in FIG. 2.

Figure 4A:
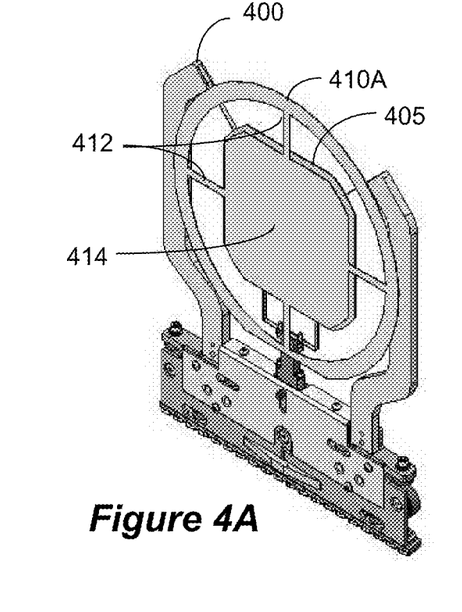
FIGS. 4A-4C illustrate an embodiment for detachable masks particularly suitable for avoiding or removing edge shunt in accordance with one embodiment of the invention.
Figure 4B:
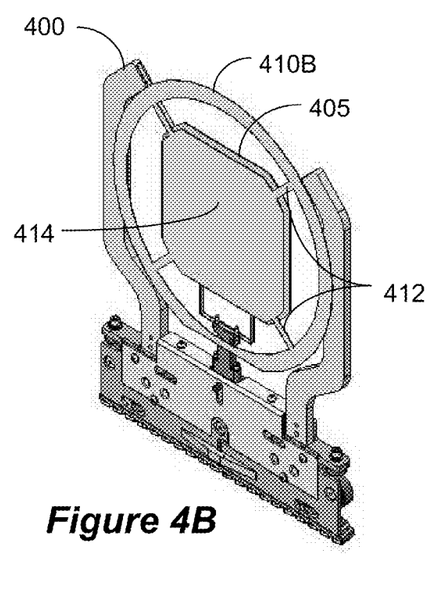
Figure 4C:
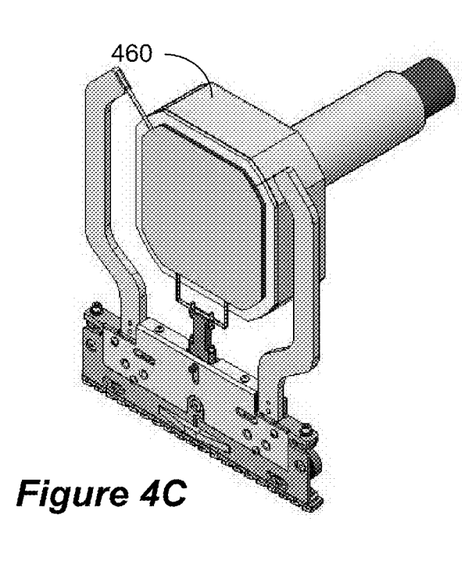

FIGS. 4A and 4B illustrate an embodiment for detachable masks particularly suitable for avoiding or removing edge shunt. In FIGS. 4A and 4B the masks 410A and 410B are seen loaded onto the carrier 400 so as to obscure much of substrate 405 surface, while exposing a thin area about the circumference of the substrate 405. In practice, after the top conductor layer is completed, mask 410A is loaded onto the carrier 400 and the carrier moves into a milling chamber such as, e.g., an ion beam or plasma etch chamber. In the chamber a biased electrode 460 (FIG. 4C, note that for clarity the mask 410 is not shown in FIG. 4C) faces the back side of the substrate and ion milling is performed on the front side by, e.g., igniting plasma on the mask side using appropriate etching gas. In this manner, the ion milling process etches the conductor layer only about the exposed periphery. By using a sub-atmospheric pressure plasma etch of $C_2H_2/H_2/Ar$ or other etchant gasses to remove ITO, ZnO or ZAO stringers (Transmission Conducting Oxide), either on the backside of the cell, or in conjunction with a protective front surface shield, any stringers or other potential shunts can be removed efficiently and economically in situ.

As can be seen in FIG. 4A, the central part 414 of mask 410 is held by extensions 412, which obscure part of the periphery of the substrate 405. This part of the periphery cannot be etched while mask 410A is in place. Therefore, after a first ion milling step mask 410A is removed and mask 410B is loaded. Mask 410B has its extensions 412 at a different orientation than extensions 412 of mask 410A. Consequently, extensions 412 on mask 410B obscure a different part of the periphery of substrate 405. The carrier 400 with mask 410B is then transported to another ion milling chamber for a second etch step, so as to etch the part of the periphery that was previously obscured by extensions 412 of mask 410A.

Figure 5:
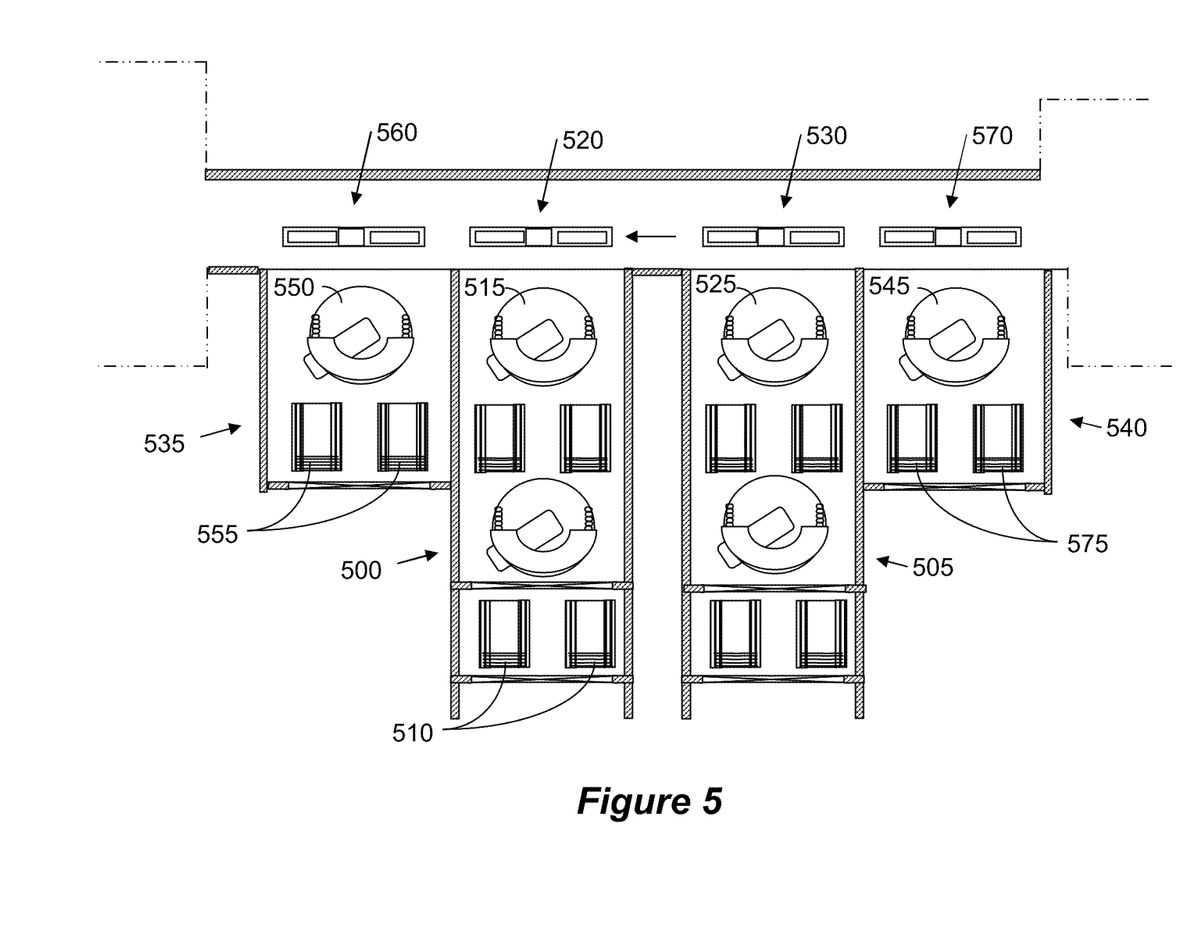
FIG. 5 illustrates another embodiment of a system employing removable mask.

FIG. 5 illustrates another embodiment of a system utilizing removable mask. Notably, in the embodiment of FIG. 5 the each carrier holds two substrates for processing. Such a dual-substrate processing system is disclosed in, e.g., U.S. Pat. No. 6,319,373. Therefore, the system itself is not shown in FIG. 5, but rather only suggested in phantom lines. The system of FIG. 5 has a substrate loading chamber 500 and substrate unloading chamber 505, similar to that disclosed in the above noted '373 patent. The loading chamber 500 has cassettes holding substrates to be processed, and robot arms 515 for loading substrates from the cassettes onto the carriers at loading position 520. The unloading chamber 505 has similar arrangement with robot arm 525 removing processed substrates from carriers at unloading position 530 and placing them in cassettes.

The embodiment of FIG. 5 also has mask loading module 535 and mask unloading module 540, the mask load/unload modules are structured to load/unload two masks simultaneously. In mask loading module a robot arm 550 loads two masks from cassettes 555 onto carriers positioned in mask loading station 560. The unloading module has a similar arrangement, wherein robot arm 545 removes two masks from carriers in mask unload station 570 and places them onto cassettes 575. Cassettes 575 may them be removed for either discarding the masks, reusing the masks buy transferring the cassettes into mask loading module, or cleaning the masks prior to reusing them.

Figure 6A:
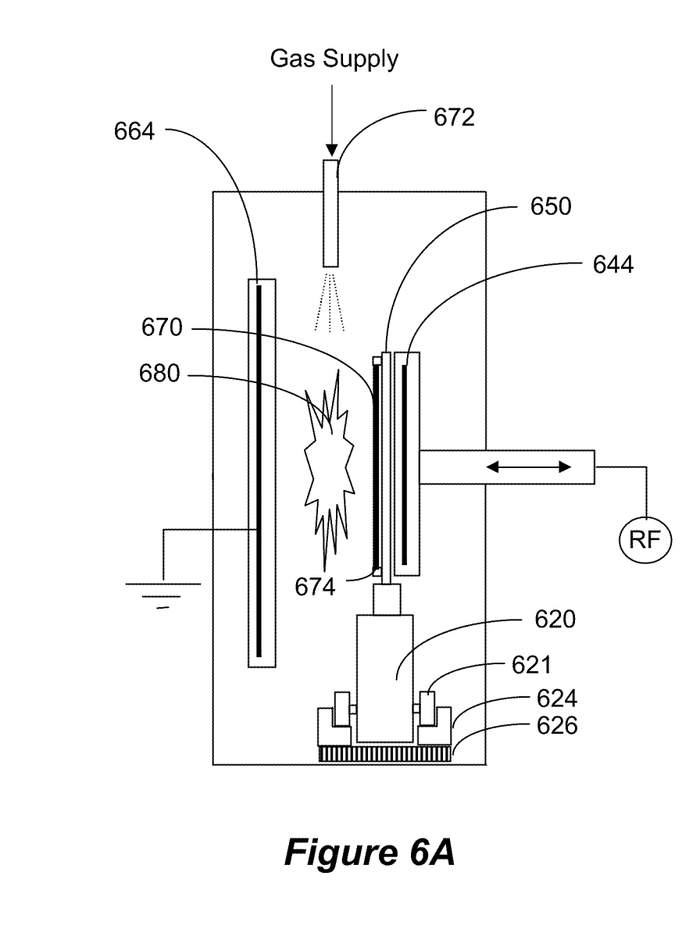
FIGS. 6A and 6B illustrate a cross section of an etch chamber processing a substrate with a removable mask, according to an embodiment of the invention.
Figure 6B:
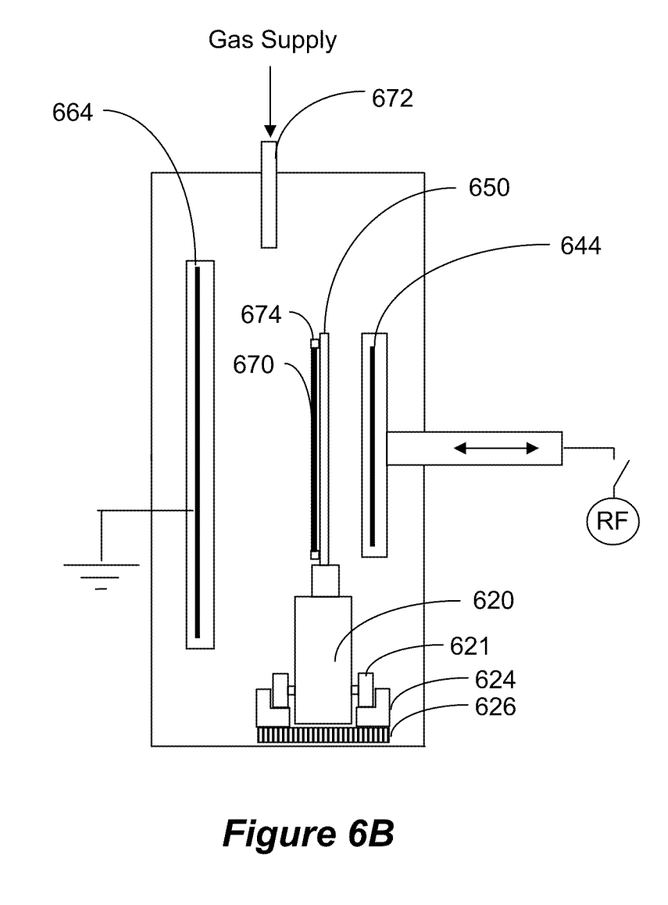

FIGS. 6A and 6B illustrate a cross section of a vacuum processing chamber according to an embodiment of the invention. The chamber may be, for example, an etch chamber and is suitable for use in the systems shown in FIGS. 3 and 5, for example. Carrier 620 has wheels 621, which ride on tracks 624. The wheels 621 may be magnetic, in which case the tracks 624 may be made of paramagnetic material. In this embodiment the carrier is moved by linear motor 626, although other motive forces and/or arrangements may be used. Substrate 650 and mask 670 are shown mounted onto carrier 620. The mask 650 may be mounted using conventional means, such as edge clips, while mask 670 may be held using elements 674, which may be, for example, clips, magnets, temporary adhesive, etc.

Once the chamber is evacuated, cathode 644 is moved into its proximal position, i.e., close to or touching the substrate 650, as illustrated in FIG. 6A. Precursor gas is supplied into the chamber via, e.g., injector 672. Plasma 680 is ignited and maintained by applying RF energy to the movable cathode 644, which opposes grounded electrode 664. While other means for igniting and maintaining the plasma may be utilized, movable cathode provides the bias energy necessary to attract the plasma species and accelerate them towards the substrate so as to sputter material from the substrate. That is, when the movable cathode 644 is moved very close to one surface of the substrate, it capacitively couples the RF energy to the substrate, so that plasma species are accelerated towards the substrate so as to etch the opposite surface. However, as shown in FIG. 6, the movable mask is placed on the other side of the substrate, such that the plasma species can only reach the periphery of the substrate.

Once processing is completed, e.g., top conductor layer has been etch around the perimeter of the substrate 650, gas supply is terminated and the plasma is extinguished. Then the cathode 644 is moved to its distal/retracted position, i.e., away from the substrate, as shown in FIG. 6B. In this position, the carrier can be transported out of the chamber and a new carrier can be moved into the chamber.

Figure 6C:
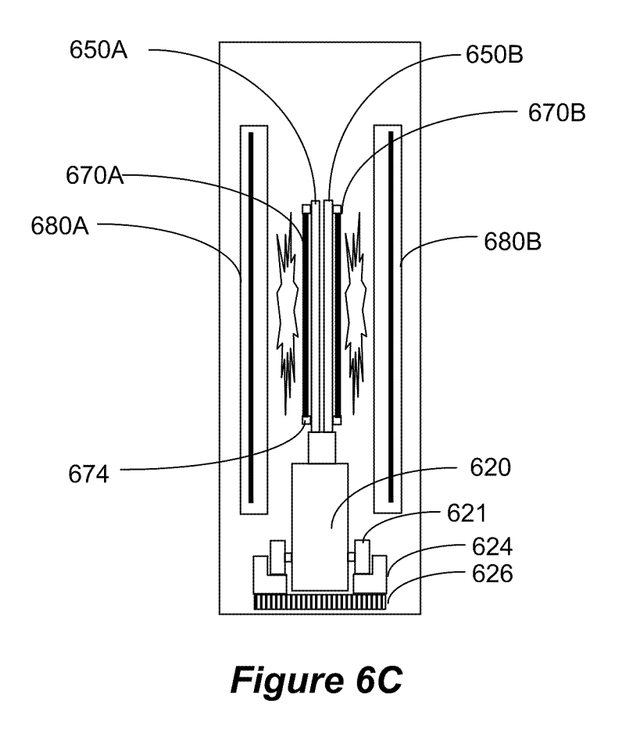
FIG. 6C illustrates a cross section of another chamber according to an embodiment of the invention.

FIG. 6C illustrates a cross section of another chamber according to an embodiment of the invention. The chamber of FIG. 6C is the similar to that of FIGS. 6A and 6B, except that two standard sputtering sources, 680A and 680B are provided for depositing desired layers on the substrate. Also, the carrier 620 supports two substrates, 650A and 650B positioned back to back. Two masks 670A and 670B are positioned to cover the front surface of each substrate. In this manner, two substrates can be processed simultaneously using a chamber having the same footprint as chambers used to process a single substrate. This feature enables doubling the throughput of the system without changing its footprint.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

The present invention has been described in relation to particular examples, which are intended in all respects to be illustrative rather than restrictive. Those skilled in the art will appreciate that many different combinations of will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system comprising:
   a plurality of processing chambers;
   substrate carriers;
   drive mechanism enabling the substrate carriers to travel from chamber to chamber; and,
   mask load/unload module for loading masks onto the substrate carriers so as to obscure at least part of substrate positioned on said substrate carrier, and unloading masks from the substrate carriers after processing the substrate;
   wherein the plurality of processing chambers comprise a first linear row of processing chambers and a second linear row of processing chambers stacked above the first linear row, and wherein the mask load/unload module comprises a mask load station and a mask unload station stacked one above the other; and,
   a lift inside the load/unload module for lifting masks between the unload station and the load station.

2. The substrate processing system of claim 1, further comprising substrate load/unload module for loading substrates onto the substrate carriers and unloading processed substrates from the substrate carriers.

3. The substrate processing system of claim 2, further comprising front end module delivering substrate cassettes to the system.

4. The substrate processing system of claim 1, wherein the mask load/unload module comprises a loadlock for introducing and removing masks into vacuum environment.

5. The substrate processing system of claim 1, wherein the mask load/unload module comprises a loadlock for introducing and removing mask cassettes into vacuum environment.

6. The substrate processing system of claim 5, wherein the mask load/unload module further comprises lift blade for removing masks from the mask cassettes.

7. The substrate processing system of claim 1, wherein the processing chambers comprise at least one of a sputtering chamber, an ion milling chamber, and an etching chamber.

8. The substrate processing system of claim 1, wherein each of said substrate carrier comprises a mechanical mechanism for attaching the mask in front of the substrate.

9. The substrate processing system of claim 1, wherein each of said substrate carrier comprises a magnetic mechanism for attaching the mask in front of the substrate.

10. The substrate processing system of claim 1, wherein the substrate carrier is structured to support two substrates simultaneously.

11. The substrate processing chamber of claim 10, wherein the substrate carrier is structured to support the two substrates back to back, such that the two substrates face each other.

12. The substrate processing chamber of claim 10, wherein the substrate carrier is structured to support the two substrates in tandem, one behind the other, and wherein the mask load/unload module is structured to load/unload two masks simultaneously.

13. The substrate processing chamber of claim 11, wherein at least one of the processing chambers is a sputtering chamber having two sputtering sources, each positioned so as to sputter coating material onto surface of one of the two substrates.

14. The substrate processing chamber of claim 12, wherein at least one of the processing chambers comprises an etch chamber having a movable cathode.

15. The substrate processing chamber of claim 1, wherein at least one of the processing chambers comprises an etch chamber and wherein the masks are configured to obscure the substrates' surface while exposing a thin area about the circumference of the substrates.

* * * * *